(12) United States Patent
Lorenzini et al.

(10) Patent No.: US 9,747,823 B2
(45) Date of Patent: Aug. 29, 2017

(54) PORTABLE DISPLAY BOARD FOR MULTIMEDIA DEVICES

(71) Applicants: Ann Louise Lorenzini, Chazy, NV (US); Bowen Lorenzini Christopher, Chazy, NY (US)

(72) Inventors: Ann Louise Lorenzini, Chazy, NV (US); Bowen Lorenzini Christopher, Chazy, NY (US)

( * ) Notice: Subject to any disclaimer, the term of this patent is extended or adjusted under 35 U.S.C. 154(b) by 0 days.

(21) Appl. No.: 14/738,898

(22) Filed: Jun. 14, 2015

(65) Prior Publication Data

US 2016/0365014 A1 Dec. 15, 2016

(51) Int. Cl.
| | |
|---|---|
| *A45D 19/04* | (2006.01) |
| *A47J 47/16* | (2006.01) |
| *F16M 11/00* | (2006.01) |
| *G09F 15/00* | (2006.01) |
| *H05K 5/02* | (2006.01) |
| *G09F 27/00* | (2006.01) |
| *G09F 9/30* | (2006.01) |
| *A47G 23/02* | (2006.01) |
| *A47B 97/04* | (2006.01) |
| *A47F 1/14* | (2006.01) |
| *A47G 1/16* | (2006.01) |
| *B60R 1/02* | (2006.01) |
| *A47F 7/14* | (2006.01) |
| *A47G 1/04* | (2006.01) |
| *G09F 1/00* | (2006.01) |

(Continued)

(52) U.S. Cl.
CPC ............ *G09F 15/0062* (2013.01); *G09F 9/30* (2013.01); *G09F 15/0068* (2013.01); *G09F 27/00* (2013.01); *H05K 5/0204* (2013.01); *B42D 15/022* (2013.01); *B42D 15/042* (2013.01); *B42D 15/045* (2013.01); *F16M 13/00* (2013.01); *G09F 1/00* (2013.01); *G09F 1/06* (2013.01); *G09F 1/12* (2013.01); *G09F 7/18* (2013.01)

(58) Field of Classification Search
CPC .......... G09F 1/00; G09F 1/06; G09F 15/0056; G09F 15/0062; G09F 15/0068; G09F 1/10; G09F 1/12; G09F 27/00; G09F 15/0012; G09F 7/18; F16M 13/00; F16M 11/041; B42D 15/042; B42D 15/022; B42D 15/045
USPC ...... 248/188.8, 188.9, 450, 453, 473, 475.1, 248/488, 152, 174, 176.1, 459, 460; 40/606.01, 778, 124.01, 124.09, 124.12, 40/539; 160/135, 351
See application file for complete search history.

(56) References Cited

U.S. PATENT DOCUMENTS

| | | |
|---|---|---|
| 2,867,045 A | 1/1956 | Millgate |
| 4,045,897 A | 9/1977 | Gates |

(Continued)

OTHER PUBLICATIONS http://www.posterpresentations.com/html/science_poster_board_display.html.

(Continued)

*Primary Examiner* — Leslie A Nicholson, III
*Assistant Examiner* — Taylor Morris

(57) ABSTRACT

Portable display boards of the type commonly used for business and educational presentations in conferences, trade shows and fairs, for example, that can be made from a variety of materials including foam board and rigid paper pulp are provided with multimedia device mounts for attaching a multimedia device to the front face of a display board, base stands, and protective corners.

7 Claims, 22 Drawing Sheets

(51) Int. Cl.
  *G09F 1/08* (2006.01)
  *A47H 1/06* (2006.01)
  *B42D 15/04* (2006.01)
  *F16M 13/00* (2006.01)
  *G09F 7/18* (2006.01)
  *B42D 15/02* (2006.01)
  *G09F 1/06* (2006.01)
  *G09F 1/12* (2006.01)

(56) References Cited

U.S. PATENT DOCUMENTS

| | | | |
|---|---|---|---|
| 4,436,135 A | 3/1984 | Ytter | |
| 4,711,046 A | 12/1987 | Herrgod | |
| 4,759,520 A * | 7/1988 | Levine | A47G 5/00 160/114 |
| 4,926,609 A | 5/1990 | Arico | |
| 5,658,635 A | 8/1997 | Davis et al. | |
| 5,664,749 A * | 9/1997 | Kump | G09F 15/0012 248/205.3 |
| 5,960,848 A * | 10/1999 | Schirer | G09F 15/0068 160/135 |
| 5,988,582 A | 11/1999 | Olivo | |
| 6,412,744 B1 | 7/2002 | Wollam et al. | |
| 6,615,551 B2 | 9/2003 | Chesser et al. | |
| 6,767,215 B2 | 7/2004 | Robertson | |
| 6,772,816 B2 | 8/2004 | Carter et al. | |
| 6,779,286 B2 | 8/2004 | Shaffer et al. | |
| 7,040,899 B2 | 5/2006 | Armstrong | |
| 7,225,573 B2 | 6/2007 | Shaffer | |
| 7,380,765 B2 * | 6/2008 | Shiff | A47B 97/04 248/124.1 |
| 7,451,800 B2 | 11/2008 | Johnson | |
| 7,685,751 B2 * | 3/2010 | Knoernschild | G09F 1/10 248/152 |
| 7,744,048 B1 * | 6/2010 | McKellery | F16M 11/32 248/176.1 |
| 7,866,075 B2 * | 1/2011 | Meeker | G09F 7/18 248/466 |
| 8,047,851 B1 | 11/2011 | Baxter | |
| D691,653 S | 10/2013 | Benadon | |
| 8,646,739 B2 * | 2/2014 | Moyer | F16M 11/041 220/4.21 |
| 8,714,351 B2 * | 5/2014 | Toulotte | A45C 11/00 206/320 |
| 2002/0029236 A1 | 3/2002 | Burgel et al. | |
| 2004/0075866 A1 | 4/2004 | Thormodsen et al. | |
| 2009/0053685 A1 | 2/2009 | Common | |
| 2010/0165407 A1 | 7/2010 | Witkowski et al. | |
| 2010/0180213 A1 | 7/2010 | Karageorgos et al. | |
| 2011/0033123 A1 * | 2/2011 | Lou | B42D 15/022 382/232 |
| 2011/0239505 A1 | 10/2011 | Fink | |
| 2011/0319162 A1 | 12/2011 | Corcoran | |
| 2012/0057295 A1 | 3/2012 | Simpson et al. | |
| 2012/0080577 A1 * | 4/2012 | McIntyre | F16M 11/041 248/346.04 |
| 2013/0025174 A9 | 1/2013 | Sapp | |
| 2013/0036635 A1 | 2/2013 | Mayer et al. | |
| 2013/0048517 A1 * | 2/2013 | Mecchella | A45C 11/00 206/216 |
| 2014/0001324 A1 * | 1/2014 | Bowles | G06F 1/1613 248/229.1 |

OTHER PUBLICATIONS http://www.ncbi.nlm.nih.gov/pmc/articles/PMC3798019/.
http://www.sfn.org/Annual-Meeting/Neuroscience-2015/Abstracts/Presenter-Resources/Poster-Presentations.
http://zerista.com/2014/07/zerista-helps-aaps-makes-scientific-conference-content-portable-and-personalized.
http://ask.metafilter.com/239672/Thin-screen-or-tablet-for-poster-presentations.

* cited by examiner

PORTABLE DISPLAY BOARD FOR MULTIMEDIA DEVICES

CROSS-REFERENCE TO RELATED APPLICATIONS

This application claims the benefit of Provisional Application No. 62/144,888, filed on Apr. 8, 2015; Provisional Application No. 62/087,268, filed on Dec. 4, 2014; and Provisional Application No. 62/058,748, filed on Oct. 2, 2014.

STATEMENT REGARDING FEDERALLY SPONSORED RESEARCH OR DEVELOPMENT

Not applicable.

FIELD OF THE INVENTION

This invention relates to poster or display boards for presentations.

BACKGROUND OF THE INVENTION

Display boards are manufactured in a variety of shapes and styles, the most popular being tri-fold display boards made of rigid paper pulp and/or foam material that is divided into folding panels with single score marks. Collage style display boards are used for the public display of individual pieces of printed information that are adhered to the front surface of the display board in a scrapbook like fashion.

Typically display boards are placed on tables and are used for presentations or exhibitions, usually in educational or business settings. In these contexts, the display boards are often accompanied by multimedia devices, such as tablets, e-readers and laptop computers that can display related and/or interactive content. When used in this manner, a multimedia device typically rests separately on a table near the base of the display board, which is often not at eye level. The positioning of the multimedia device on the table does not support its ease of viewing or integration with the other information on the display board. More recently, Quick Response Codes (QR Codes) have been employed to add dynamic content to display materials. This method, while enhancing dynamic content, requires the viewer to take a second step which can result in the viewer losing interest.

Other current techniques, such as simply gluing printed materials and a multimedia device to standard display boards can appear less professional and can make it difficult to remove the multimedia device and printed materials from the display board without damage. In addition, when multimedia devices are attached to the display board it can become top heavy and increase the chance of the display falling over and may no longer be able to fold flat. Lastly, display board corners can be damaged during transportation, set up or break down, which can degrade the appearance and limit the life of the display board.

Therefore, what is needed is a portable display board for multimedia devices that folds flat and can interface with custom print services.

SUMMARY OF THE INVENTION

The present invention provides a portable display board with removable multimedia mounts and washer plates for securing a multimedia device to the front of the display board, base stands for stabilization, and corner protectors to maintain the aesthetic appearance of the display board, dual score marks for folding, and for a technique that determines the mounting method on the display board.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the invention principles.

DETAILED DESCRIPTION OF PREFERRED EMBODIMENTS

Portable display boards for use in presentations and exhibitions are typically constructed of foam board or paper pulp, including cardboard. A common example is a tri-fold board in which the display board has three panels connected by a single hinge or fold so that the board can both be folded up for easier transport and storage and be stood up on a table or other surface while being displayed.

Figure 1:
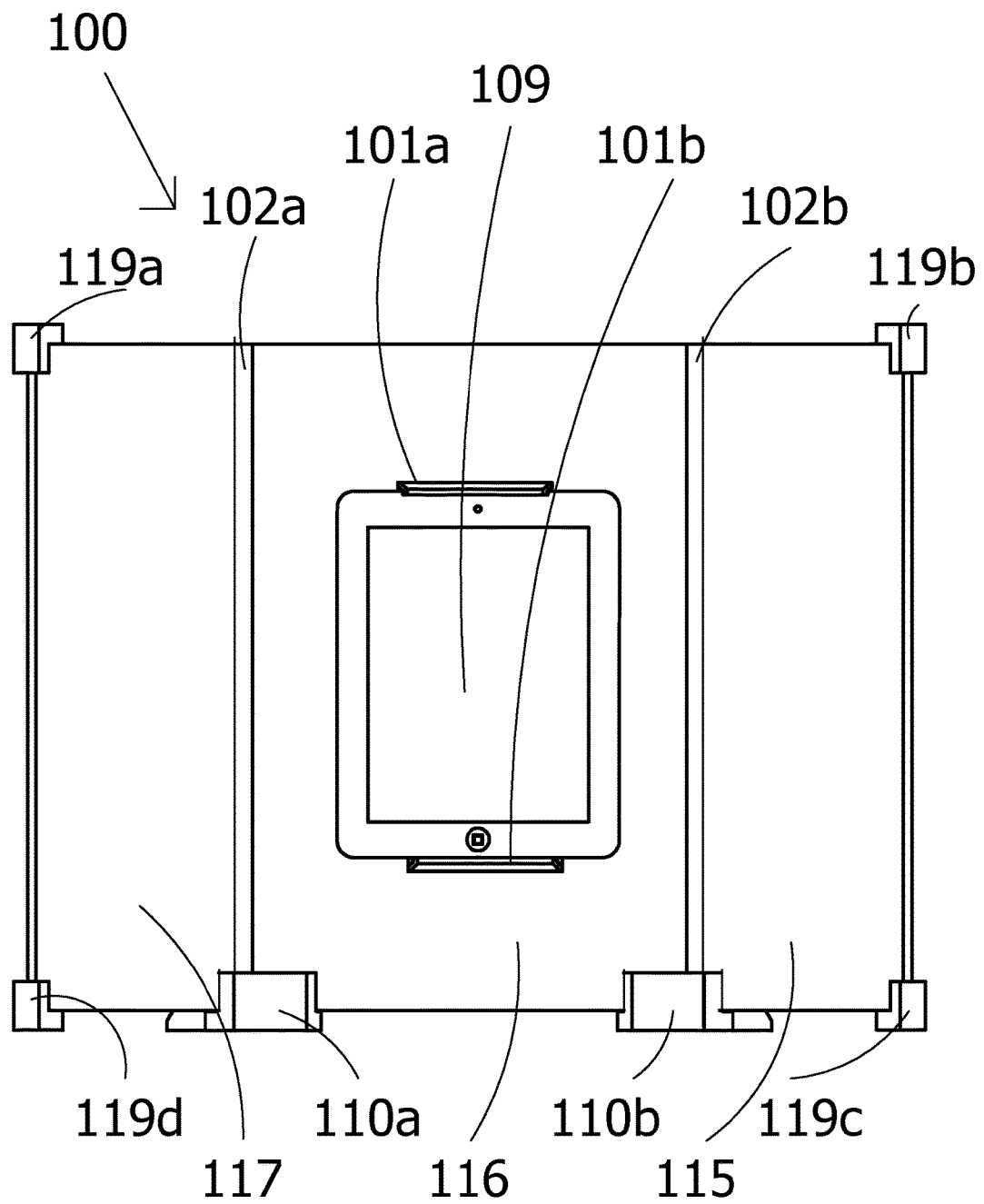
FIG. 1 is a front view of a display board of the present invention.
Figure 2:
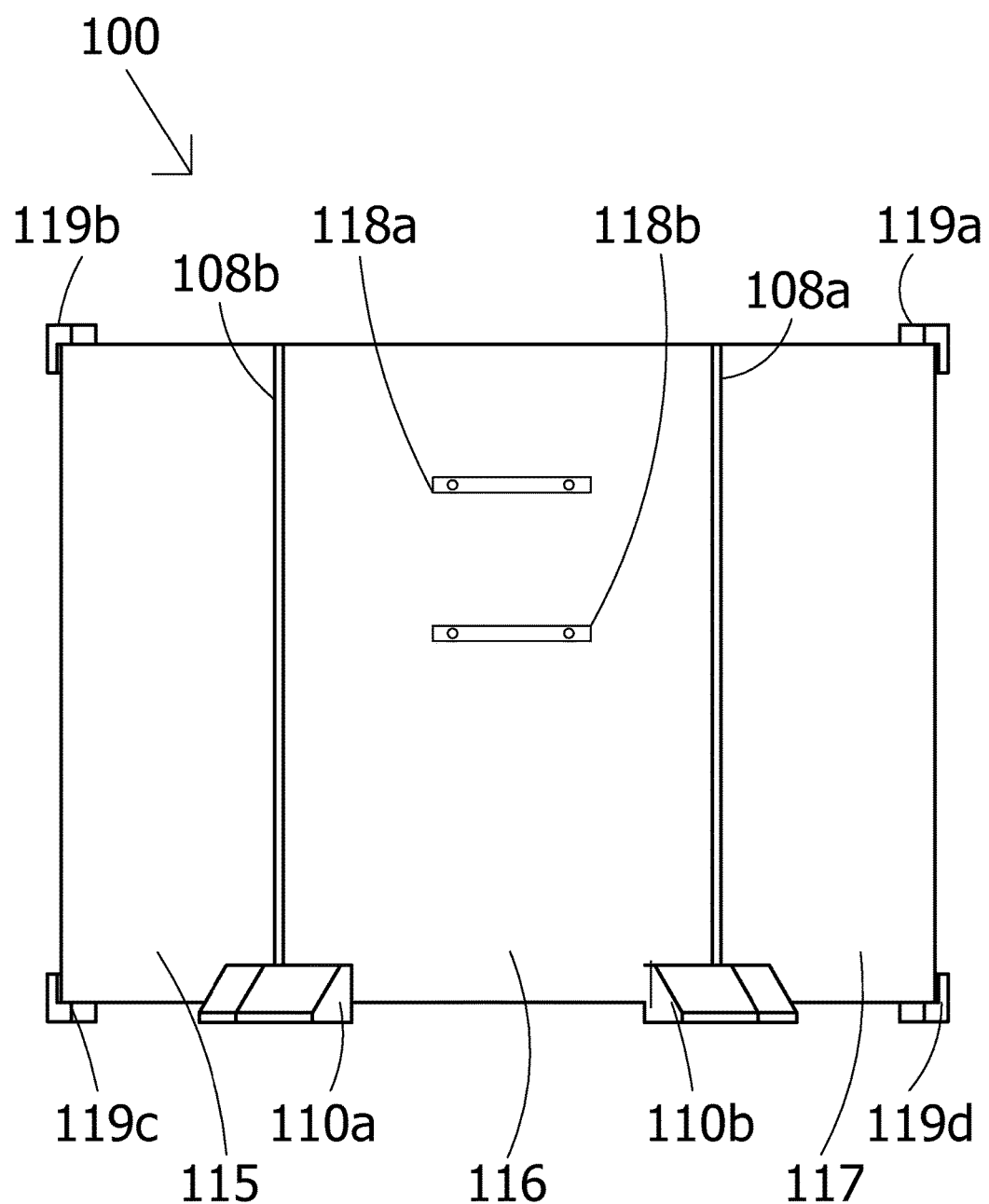
FIG. 2 is a rear view of a display board of the present invention.
Figure 8:
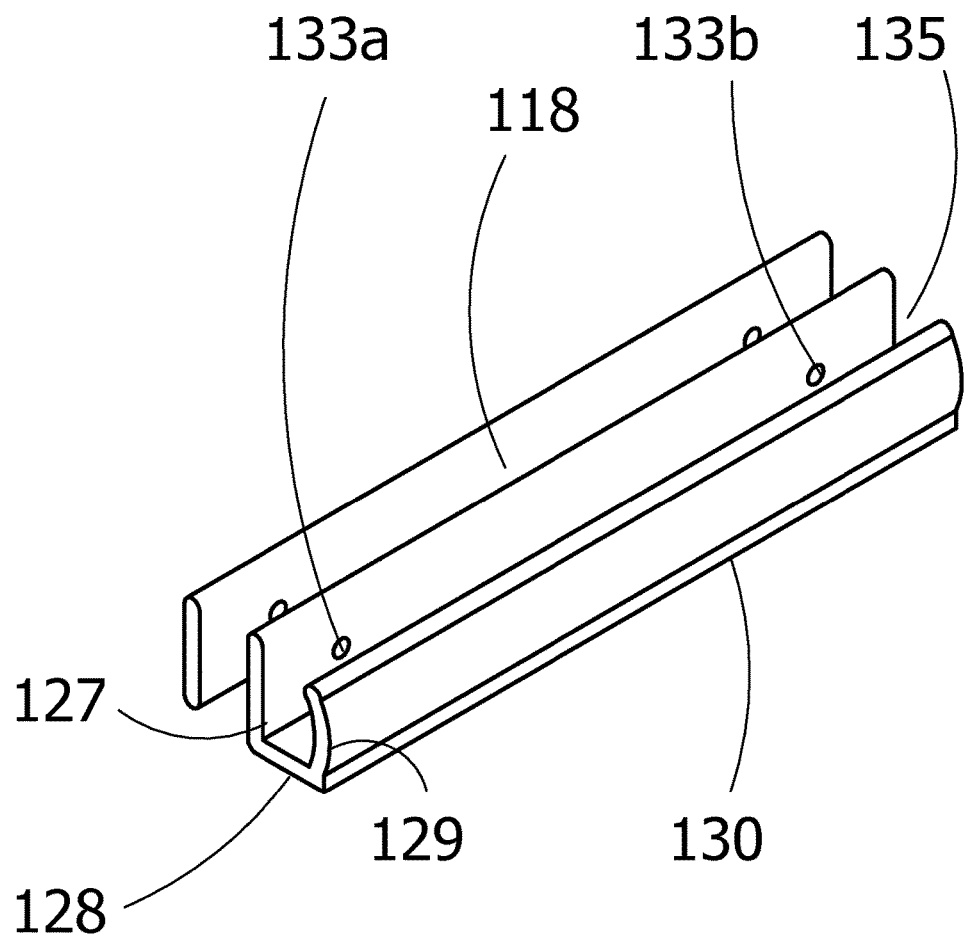
FIG. 8 is a perspective view of bar mounts and washer plates of the present invention.
Figure 9:
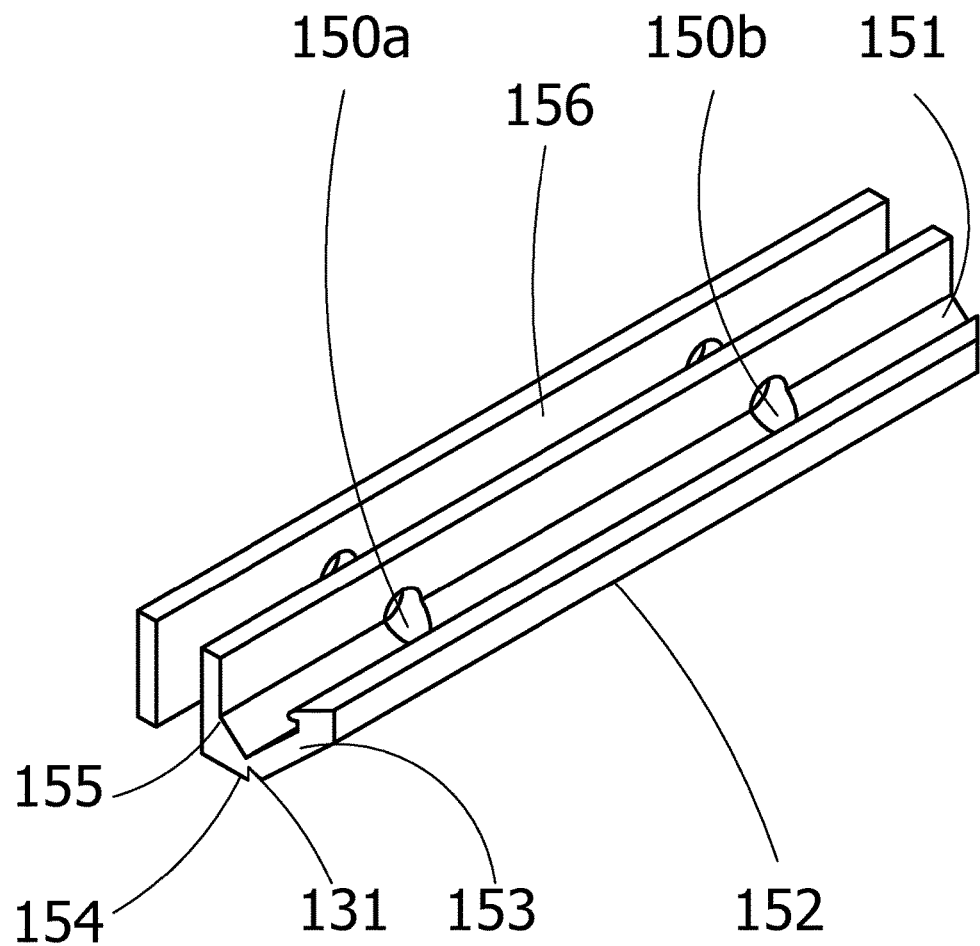
FIG. 9 is a perspective view of another bar mount embodiment.
Figure 10:
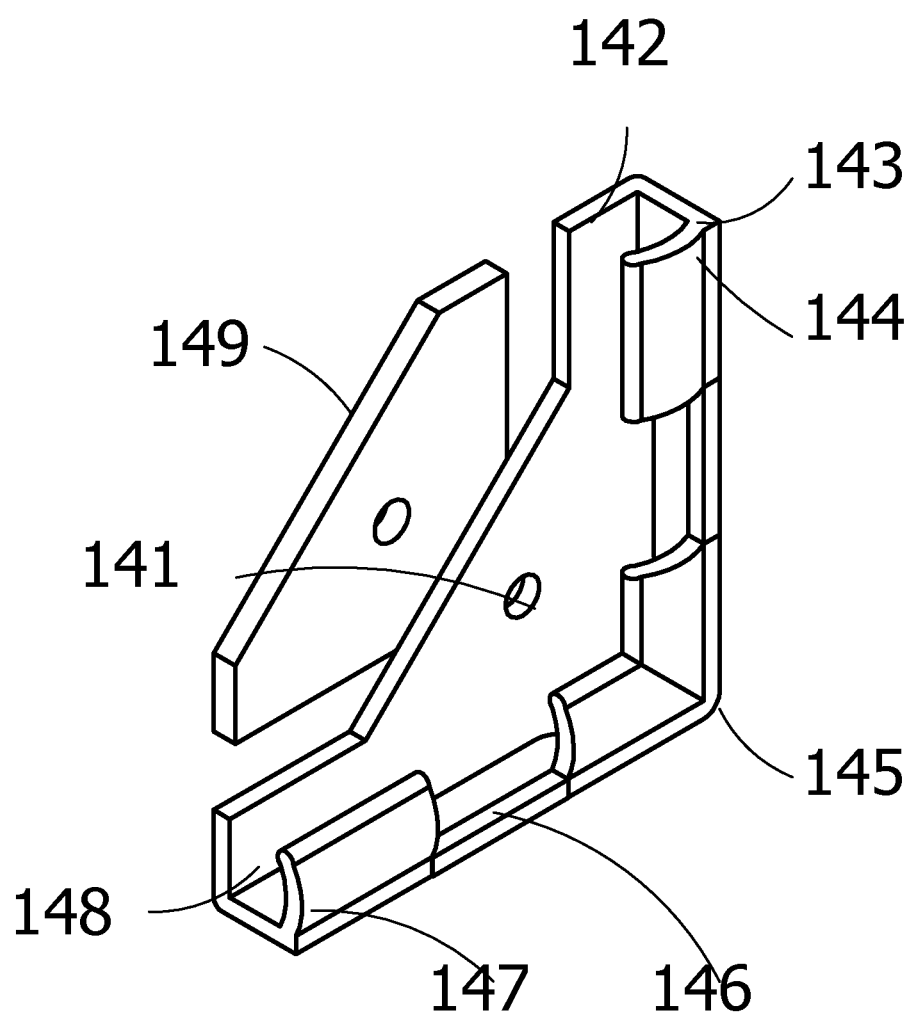
FIG. 10 is a perspective view of a corner mount of the present invention.

FIG. 1 shows an improved tri-fold display board 100 of such type that includes two sets of dual score marks 102a and 102b that are folded to form a left panel 117, center panel 116 and right panel 115, and that includes one set of removable multimedia device mounts (101a, 101b), but it will be understood that display boards of the present invention may have more than one set of multimedia mounts for attaching more than one multimedia device and that display boards may have one or more panels. Multimedia device mounts 101a and 101b are depicted as generally bar like shapes FIG. 8 and FIG. 9 with a somewhat irregular quadrilateral profile, but they can be any shape, depending on the intended use and type of multimedia device and display board. Mounts may have three sides, back 127, base 128 and front 129, as shown in FIG. 8, back 155, base 154 and front 153 as shown in FIG. 9, and back 142, base 143, and front 144 as shown in FIG. 10 and may include a hinge 131 for device release as shown in FIG. 9.

Figure 4:
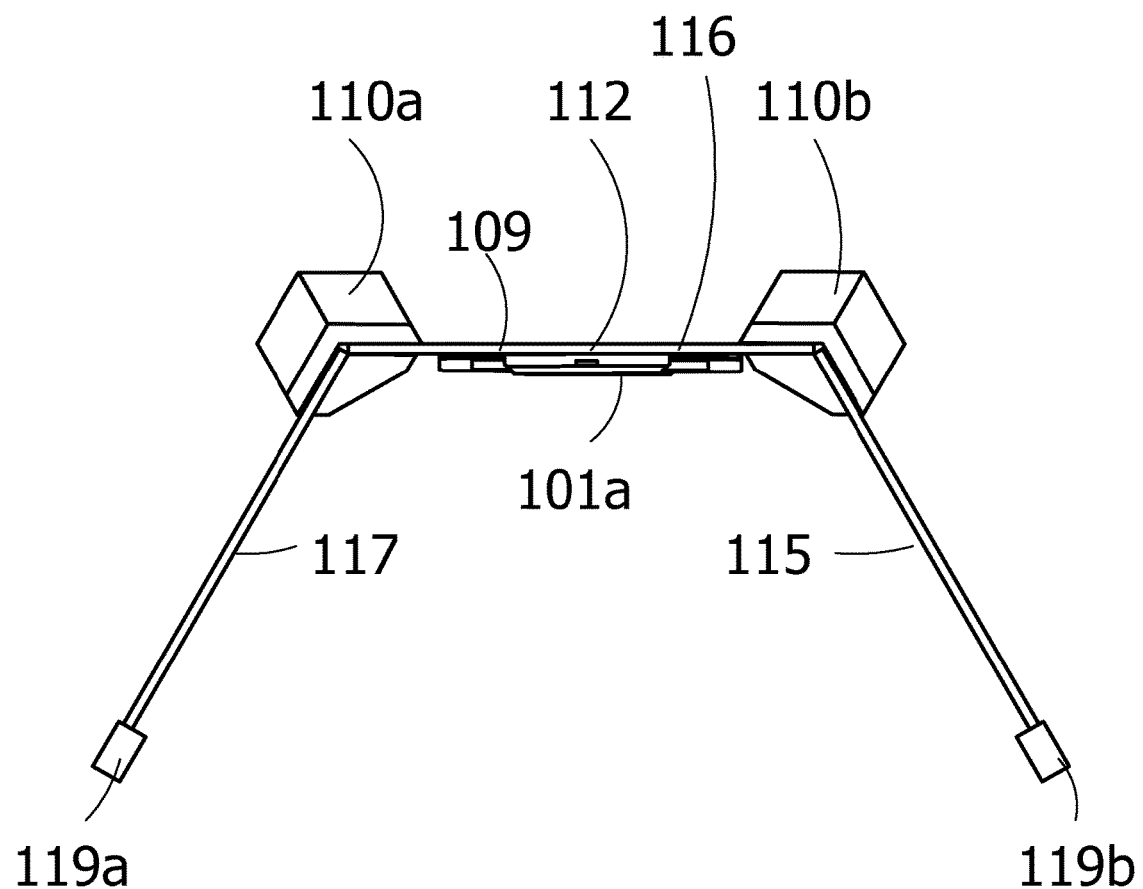
FIG. 4 is a top view of the present invention.
Figure 5:
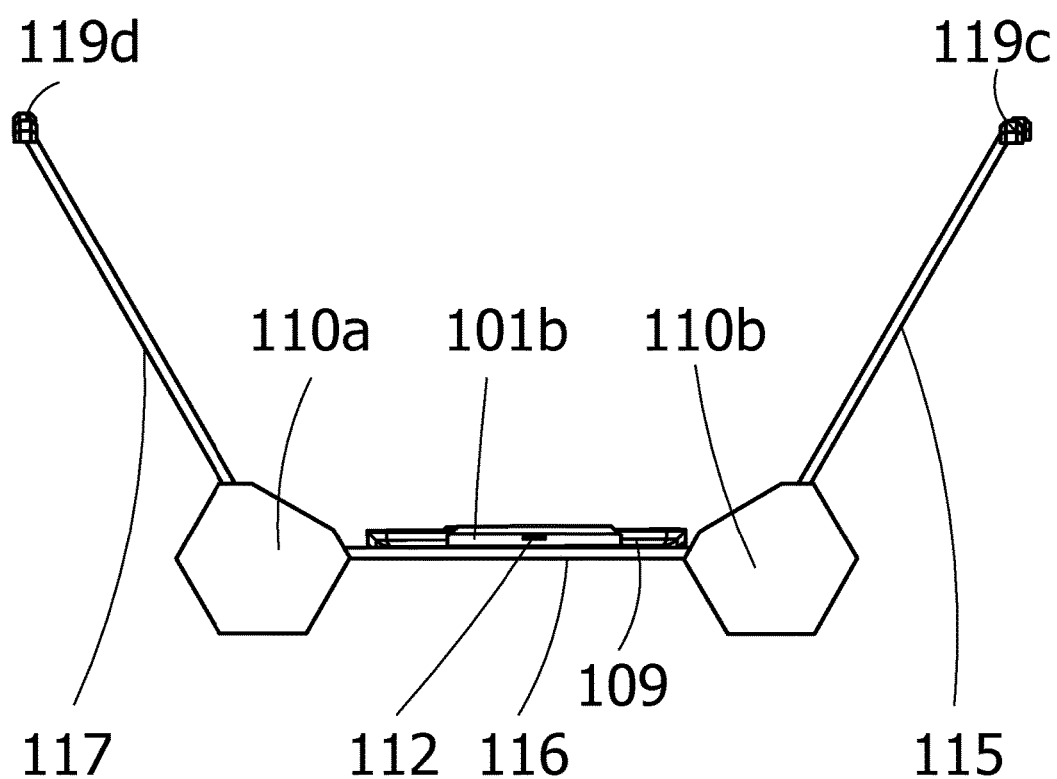
FIG. 5 is a bottom view of the present invention.

Multimedia device mounts 101a and 101b (as shown in FIG. 1) may be sized for a variety of kinds of multimedia devices, including tablets and e readers, for example. Multimedia device mounts 101a and 101b may include a contoured access carve out 112 (as shown in FIG. 4 FIG. 5) and opening 152 (FIG. 9) and opening 146 (FIG. 10) for allowing access to operational control buttons or power cords on a multimedia device while the device is attached to the display board 100. Multimedia device mounts 101a and 101b may be adjusted to accommodate a variety of multimedia devices and display boards. Multimedia device mounts 101a and 101b may be made of any suitable material, including the display board 100 material, plastic, wood, metals and composite materials including materials with magnetic proprieties. Multimedia device mounts 101a and 101b may be mesh, solid, or frames and can be attached to the front of a display board 100 by any suitable mechanism, including adhesives (for example: glue or dual sided tape), threaded pins FIG. 11, 135, rivets, hook and loop, via hinges, folds or hooks or self-hooking methods, or magnetically. Further, multimedia device mounts 101a and 101b may include a power cord opening 112, as shown in FIG. 4, FIG. 5, and FIG. 10.

Figure 11:
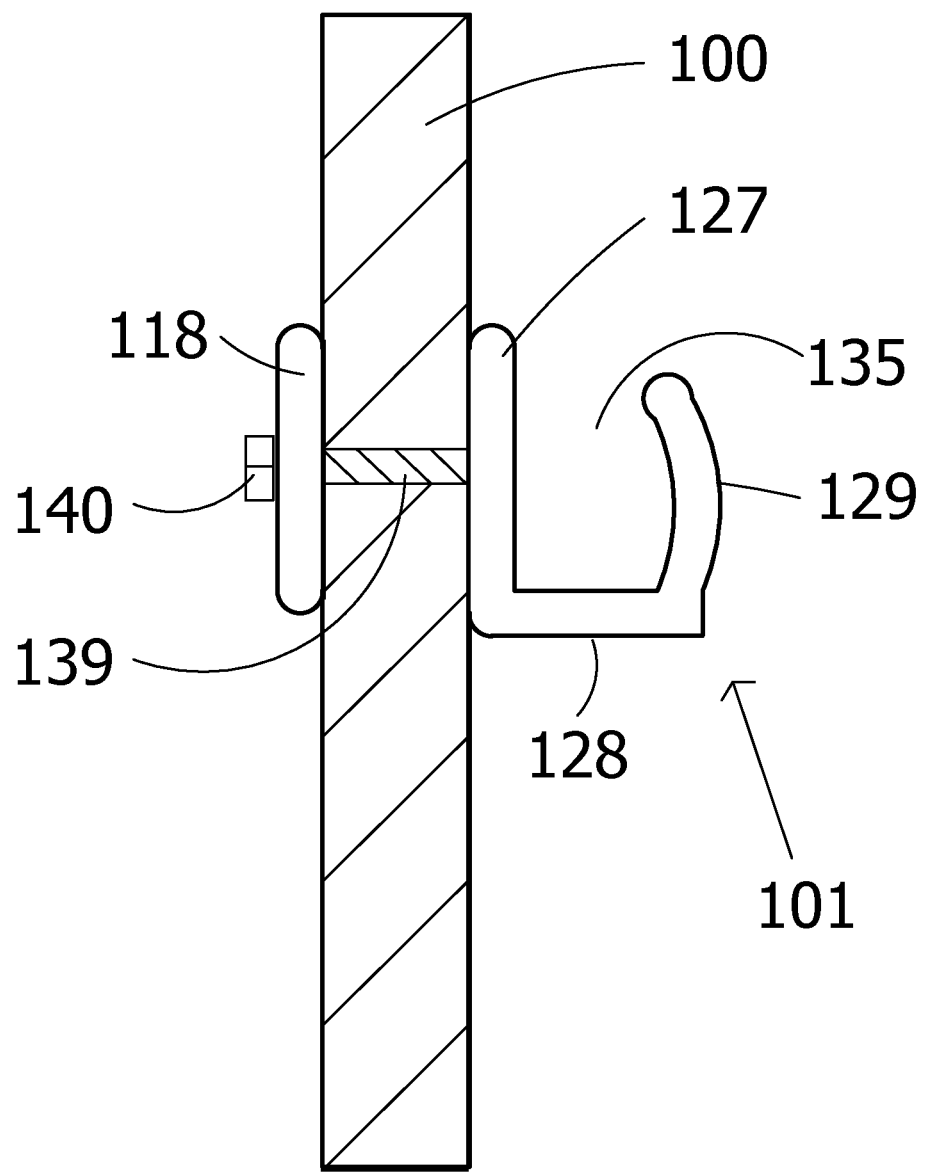
FIG. 11 a side view of bar mounts and washer plates embodiment.
Figure 17:
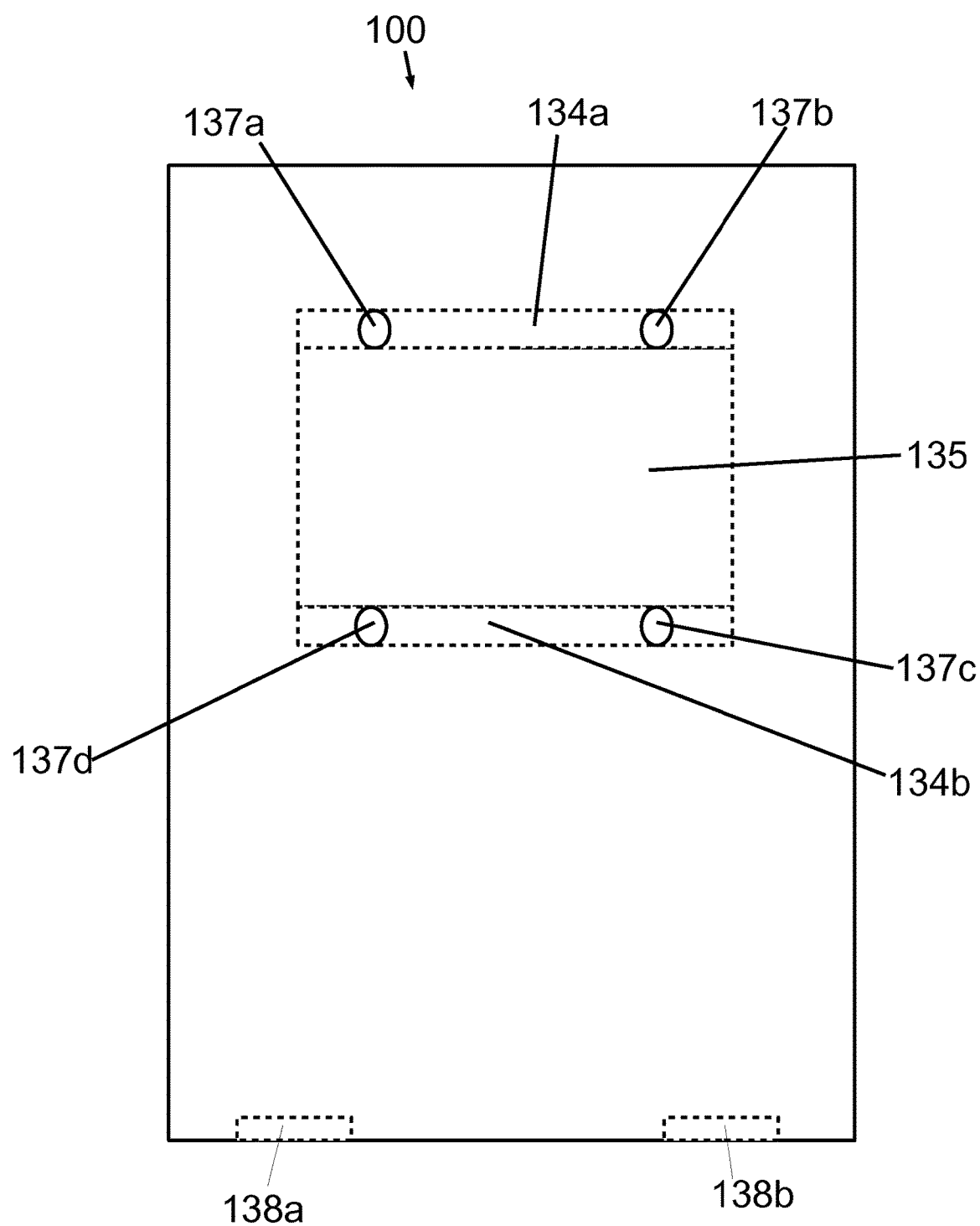
FIG. 17 depicts an example of a custom print template for a portable display board with one panel of the present invention.

In operation, a multimedia device 109 can be attached to the front of a display board 100 by first using techniques described below or any other way for locating the desired placement of the multimedia device mounts 101a and 101b on the display board 100. Once multimedia device mounts 101a and 101b locations are determined, the multimedia device mount method for example holes (137a, 137b, 137c, 137d, as shown in FIG. 17) are prepared using a suitable tool like a punch or drill. Any suitable mechanism, for example a threaded pin 139 as shown in FIG. 11, is inserted through the multimedia device mounts 101a and 101b, the holes 137a, 137b, 137c and 137d in the display board 100, and the multimedia washer plates 118a and 118b and secured with a nut type fastener 140. The multimedia device 109 is then slid into the multimedia mounts 101a and 101b. Other methods for insertion and attachment of the multimedia device 109 into the multimedia mounts 101a and 101b on to the display board 100 may be used, for example dual sided tape may be first attached on to the multimedia device mounts 101a and 101b, followed by the insertion of the multimedia device 109 into the multimedia device mounts 101a and 101b. Then the tape backing paper is removed and the mounted multimedia device is then adhered the display board. However, it will be understood that the multimedia device mounts 101a and 101b may be affixed to the display board 100 by any suitable mechanism, including adhesives, threaded pins, rivets, hook and loop, hooks or self-hooking, hinges or folds, or magnetically. Or the multimedia device mount can be first fixed to the display board and then the device can be slid into the mounts. In addition, an access hinge 131 can be added (as shown in FIG. 9) and a locking mechanism can be used to prevent unwanted or accidental removal of device 109 from the display board 100.

Various methods can be used for the safe removal of the multimedia device 109 from the display board 100. For example, the device can be slid out of the mounts 101a and 101b or a front hinge 131 (as shown in FIG. 9) can be opened and the device removed. Alternatively, the nut and bolt like mechanism 140 can be removed from the mounts 101a and 101b, and the washer plates 118a and 118b can be detached allowing for the multimedia mounts 101a and 101b to be lifted off the display board 100. Then the device 109 is removed from the mounts 101a and 101b.

Figure 3:
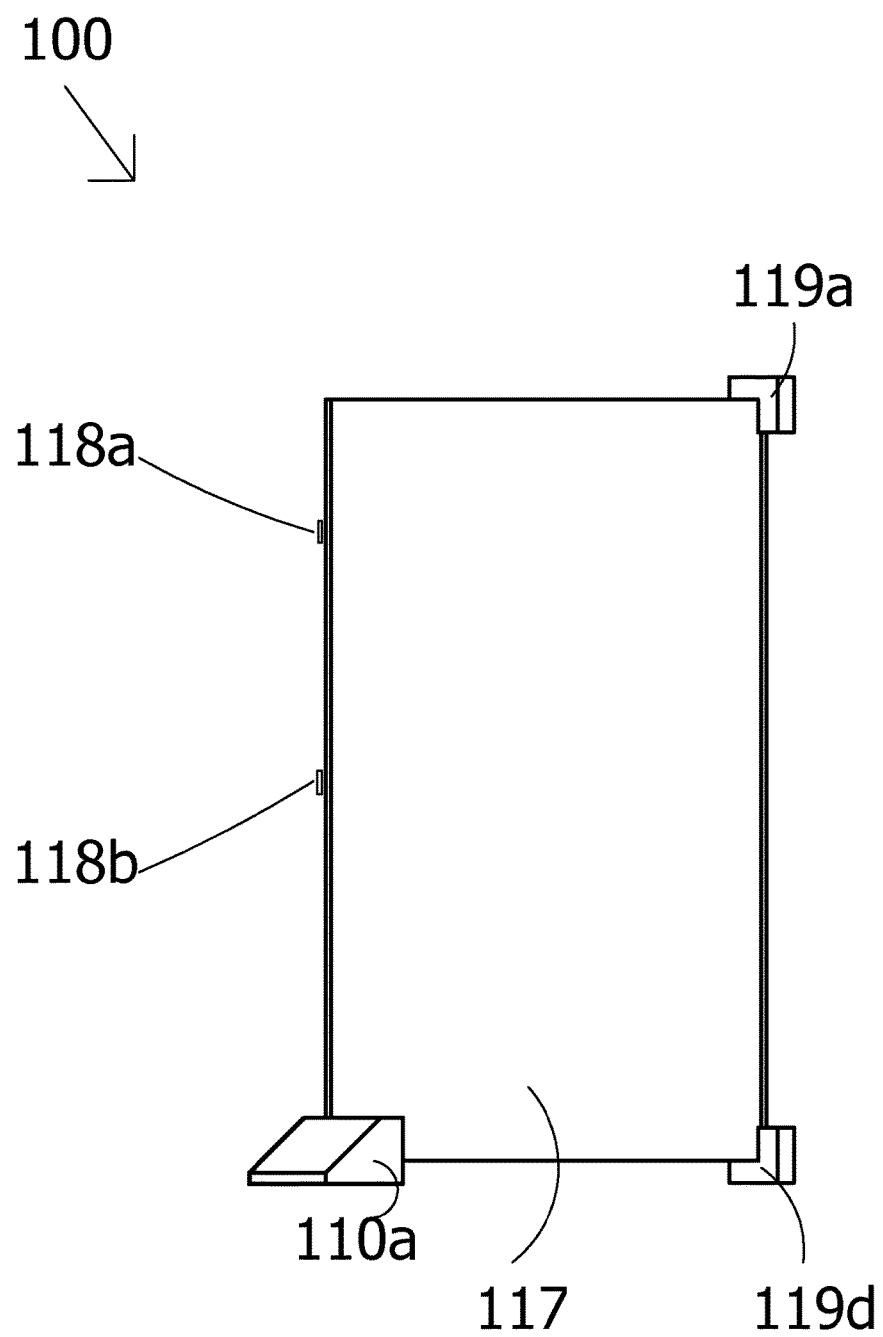
FIG. 3 is a side view of a display board of the present invention.
Figure 22:
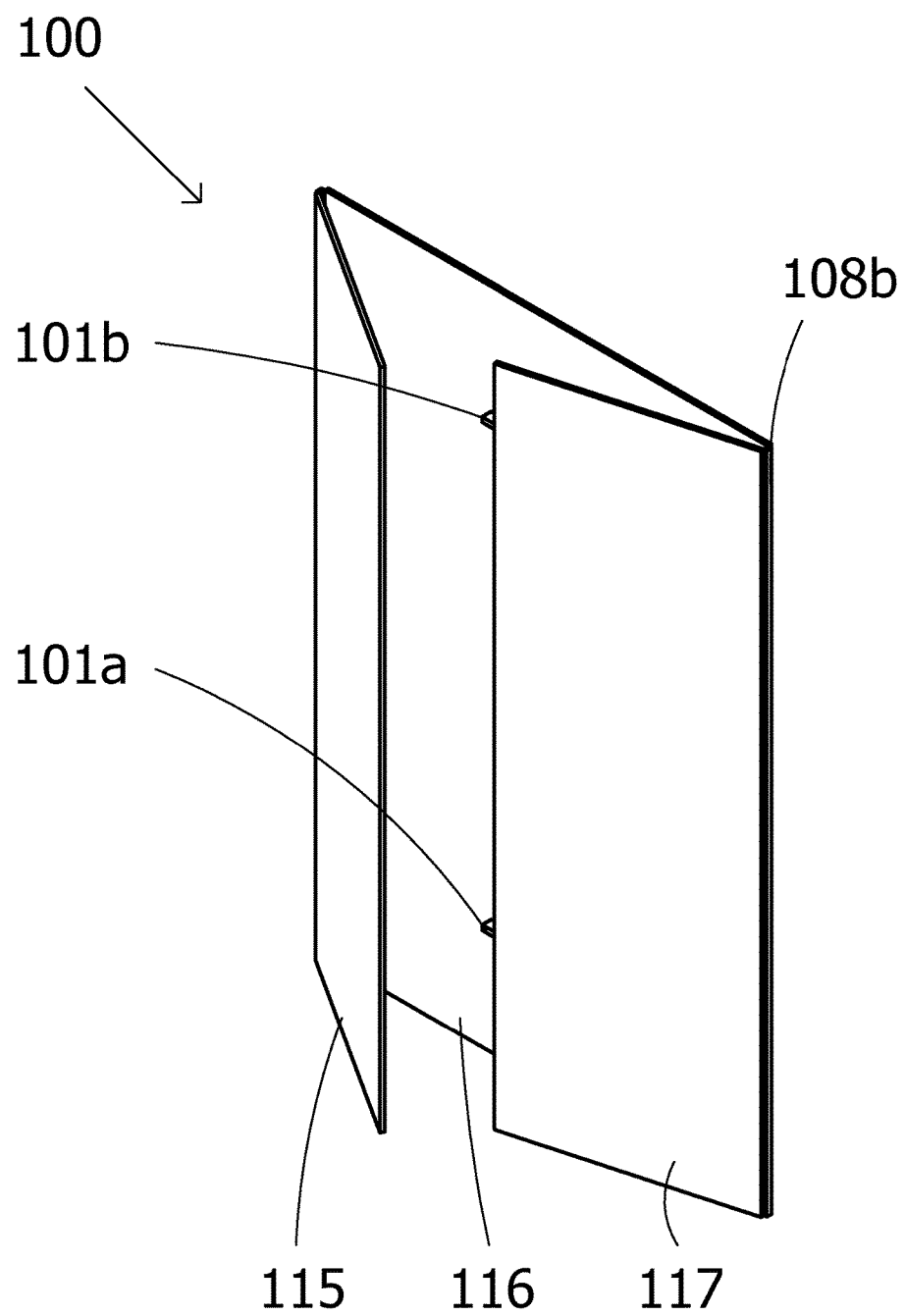
FIG. 22 depicts an example of how one embodiment of the present invention folds for storage and transportation.

FIG. 3 shows a side perspective view of the display board 100 with display board base stands 110a and 110b (also shown in FIGS. 2, 3, 4, 5 and 6 and described in more detail below). The base stands 110a and 110b orient right panel 115 and left panel 117 for balance and provide additional stability to the display board 100, which may be top heavy when a multimedia device is inserted in multimedia device mounts 101a and 101b. The bottom of display board 100 is inserted into the groove 120 (shown in FIG. 6) of the base stand 110a and 110b when the display board 100 is in a standing position. The base stands 110a and 110b extend away from the display board 100 on both the front side 122 and back side 121. Preferably, the base stands 110a and 110b could be detached from the display board 100 so that the display board can be folded flat for ease of transport and storage. The dual scores 108b (as shown in FIG. 22) allow for the display board to be folded flat over the mounts 101a and 101b with our without the device 109 inserted for storage and transportation.

Protective corner covers 119a, 119b, 119c and 119d are attached to the outside corners of display board 100 via a slot 124 (shown in FIG. 7) to increase the life of the display board 100. The protective corner covers 119c and 119d can be sized in conjunction with base stands 110a and 110b to allow the display board 100 to remain level when in a standing position.

Figure 16:
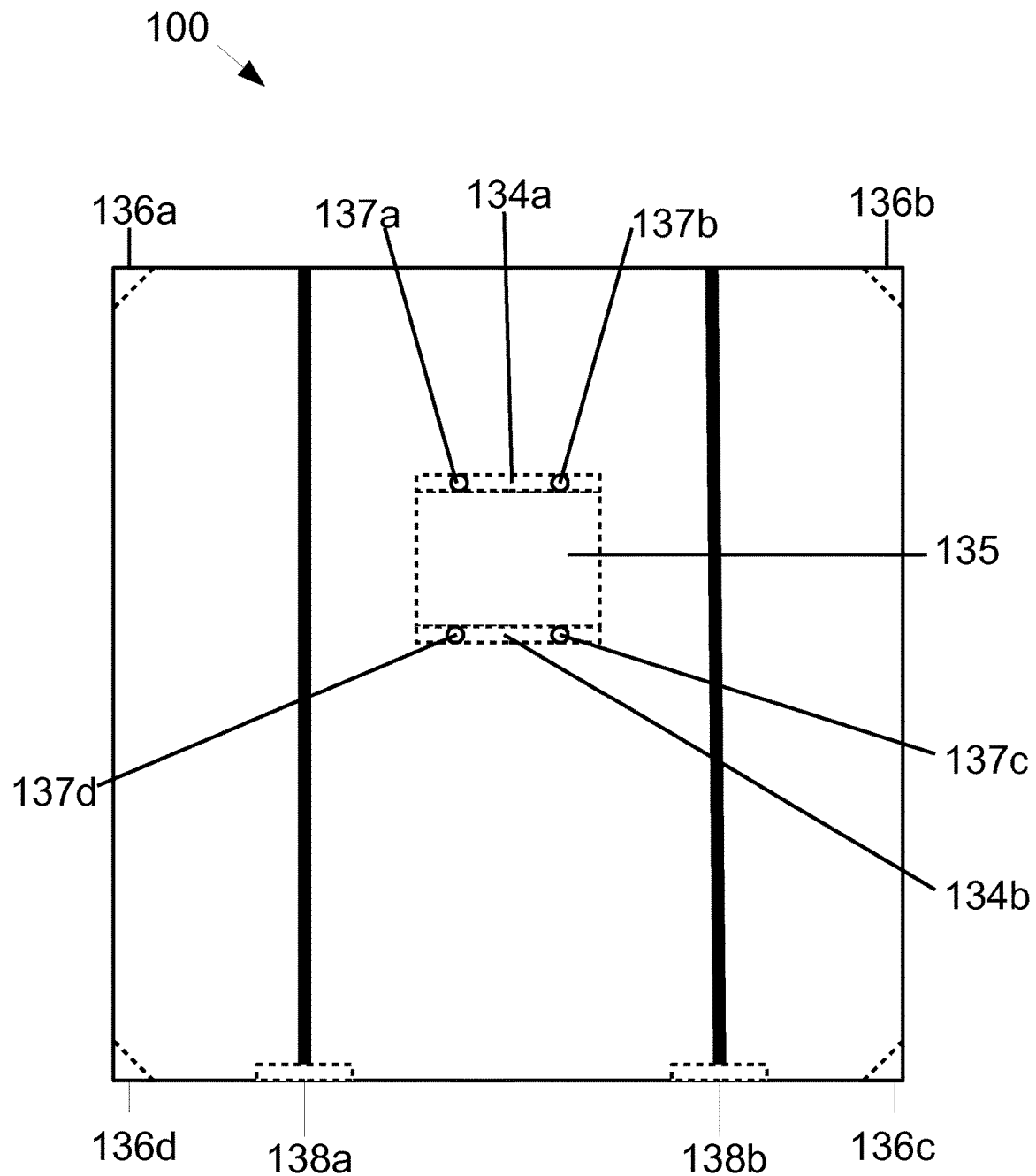
FIG. 16 depicts a custom print template for a display board with three panels of the present invention.
Figure 18:
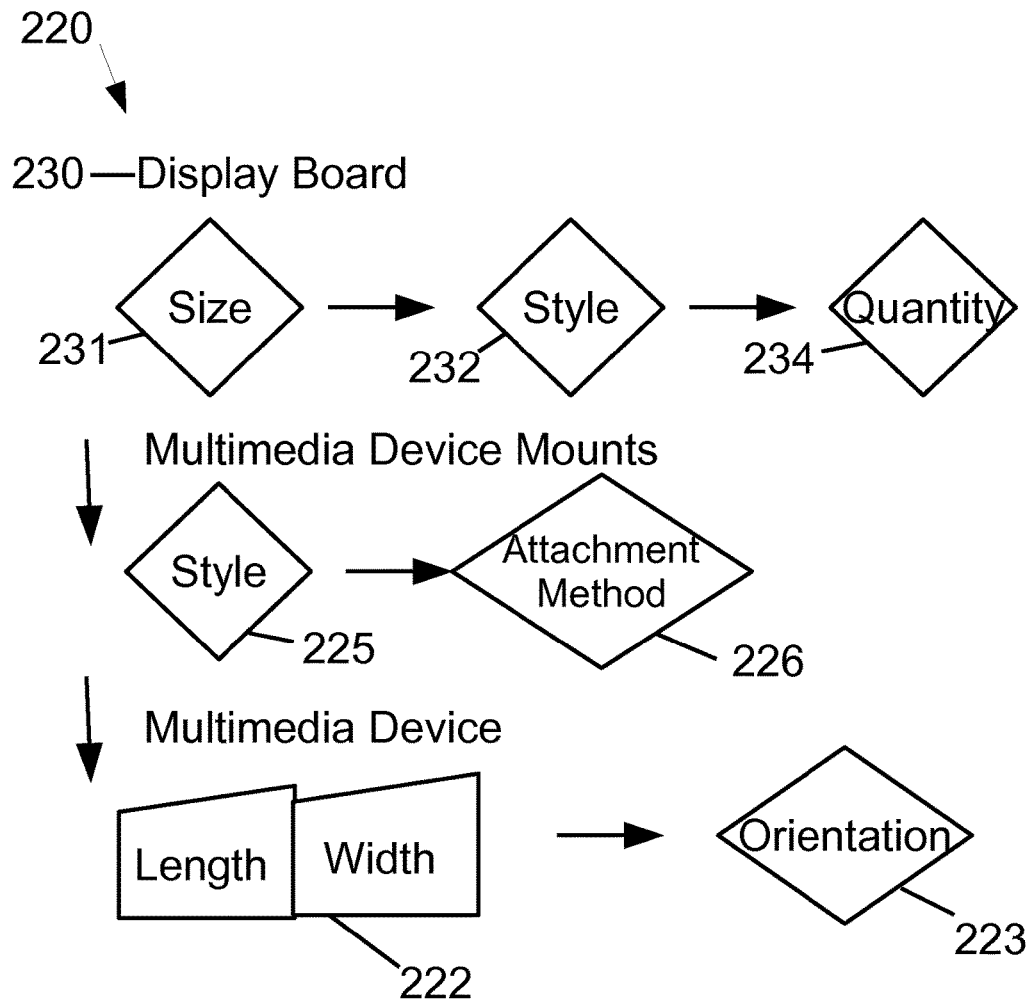
FIG. 18 depicts an aspect of an embodiment of the print/layout feature of the present invention.

In operation of an embodiment involving custom print and multimedia device positioning, as outlined in FIGS. 12-19, a user can input information about the multimedia device to be mounted on the display board. A user may, for example, select an identifying name for the multimedia device at step 221. The user may alternatively select a numeral system and input the size (length and width) of the multimedia device to be mounted at 222. The user may then select multimedia device orientation (e.g., landscape or portrait) at 223. A user may then input the number of multimedia devices to be mounted at 224. The user may then choose the multimedia device mount style (cut out, bar or corner) at 225. The user may then choose the attachment method (cut/drill, adhesive or hardware) at 226. As outlined in FIG. 14, the user may then select a display board size (e.g., small, medium, large or custom) at 231. The user then may select a display board type (e.g., one panel, two panels, three panels or custom) at 232. The user may then select a display board theme (e.g., templates or custom) at 233. The user can input the quantity of display boards at 234. As outlined in FIG. 15, a template builder module 240 determines an appropriate template or templates based on the prior user inputs. The template includes locations for multimedia device mounts, including top media mounts (101a)

at 242 and bottom mounts (101*b*) at 242. Data is merged, converted, compiled, and graphically illustrates information from 241 and 242 to generate a preview, such as depicted in FIG. 16, FIG. 17 and FIG. 18. The data output dimensions in FIG. 15 for example are generated for display board attachment locations at 244, including base stands 110*a* and 110*b* at locations 138*a* and 138*b*, multimedia device mounts 101*a* and 101*b* at locations 134*a* and 134*b*, display board drill holes at locations 137*a*, 137*b*, 137*c*, and 137*d* and protective corner covers 119*a*, 119*b*, 119*c* and 119*d* at locations 136*a*, 136*b*, 136*c* and 136*d*. The template example, as shown for example in FIG. 16, can be exported and merged into a preferred design software program at 245.

An example of an implementation of the custom print/layout feature could be as follows: A 24 inch by 36 inch tri-fold display board is selected that has folds 9 inches from the edges, and a tablet is selected that has dimensions of 6 inches by 9 inches and is to be displayed in a portrait orientation on the center panel. A default positioning could be to have the tablet centered midway within the upper half of the center panel. Therefore, the top of the tablet would be at a point 6 inches from the top of the display board and the center 9 inches from both folds. An appropriate multimedia display mount could include a top portion and a bottom portion of approximately 6 inches in length each. If both portions include two fastener elements spaced one inch from the ends of the portions, drill holes could be made in the display board at the following four locations, starting from the top of the display board at the rightmost fold: 6 inches down, 7 inches to the left of the fold; 6 inches down, 11 inches to the left of the fold; 15 inches down, 7 inches to the left of the fold; 15 inches down, 11 inches to the left of the fold. In addition, space for print or pasting a title could be allotted a rectangular space of 5 inches high by 17 inches long positioned with ⅞ inch margins from the top of the display board, each fold, and above the top portion of the multimedia device mount on the center panel of the display board.

The components of the improved display board will now be described in greater detail. Multimedia device mounts are used for removably attaching multimedia devices to a display board. In a preferred embodiment, as shown in FIG. 1, the multimedia device mounts 101*a* and 101*b* can have a profile that resembles a trapezium which is shown in FIG. 8 as a curved arch trapezium 127 or as shown in FIG. 9 as a short-lipped slanting trapezium 153. This shape allows the multimedia device mounts 101*a* and 101*b* to retain and support tablets of various dimensions. Both an angled corner 145 (FIG. 10) and bar fasteners (FIG. 8 and FIG. 9) can be formed using a profile shape of this type or similar. The multimedia device mounts 101*a* and 101*b* can be constructed with two or three sides: left 127, right 129 and bottom 128. The right or left sides may be solid with a curve, with the opposite side straight with holes (133*a* and 133*b*) to accommodate a suitable attachment method to the display board and the bottom 128 having opening 112 (as seen in FIG. 8), opening 152 (as seen in FIG. 9) and opening 146 (as seen in FIG. 10) for the insertion of multimedia device cords. The front position 135 acts as a location for a multimedia device 109. The left side holes 133*a* and 133*b* can be used for holding and coupling multimedia devices to display boards with, but not limited to, various threaded pins fasteners (137*a*,137*b*,137*c* and 137*d*), rivets (137*a*,137*b*, 137*c* and 137*d*), adhesive (134*a* and 134*b*), hook and loop (134*a* and 134*b*), and magnetically (134*a* and 134*b*). The front device location 135 may be any shape and for example in FIG. 8 and FIG. 9 is shown as a rectangle. Locations 135, 137*a*, 137*b*, 137*c*, 137*d*, 134*a* and 134*b* all provide template locations for methods of placement, attachment and or viewing of multimedia devices on display boards. These methods can involve, cutting, adhesion, and hardware type fasteners. The multimedia device mounts 101*a* and 101*b* can have bent corners 130 as shown in FIG. 10 or straight bars as shown in FIG. 8 and FIG. 9, as necessary to accommodate various multimedia devices. The multimedia device mounts 101*a* and 101*b* can be made from many materials that are solid and/or mesh, including but not limited to plastics, metal, wood, carbon fiber and composite materials including those with magnetic properties. In addition, as shown in FIG. 9, the forward portions of device mounts 101*a* and 101*b* may be connected via a hinge to facilitate the insertion and removal of multimedia devices.

Multimedia mount washer plates 118*a* and 118*b* (shown in FIG. 8 and FIG. 9) are used for attach when pins are preferred for attachment of the multimedia device mounts 101*a* and 101*b* to the display board. Washer plates 118*a* and 118*b* ensures a tight connection between the display board and the multimedia device mount. The multimedia device mounts 101*a* and 101*b* are attached to the front of the display board 100 and washer plates 118*a* and 118*b* are placed behind the display board 100 and connected to the multimedia device mounts 101*a* and 101*b* to secure the multimedia device to the display board 100 and to distribute the weight of the multimedia device 109 evenly across that portion of the display board. Washer plates 118*a* and 118*b* can be made from many materials that are solid and/or mesh, including but not limited to plastics, metal, wood, carbon fiber and composite materials including those with magnetic properties.

Figure 7:
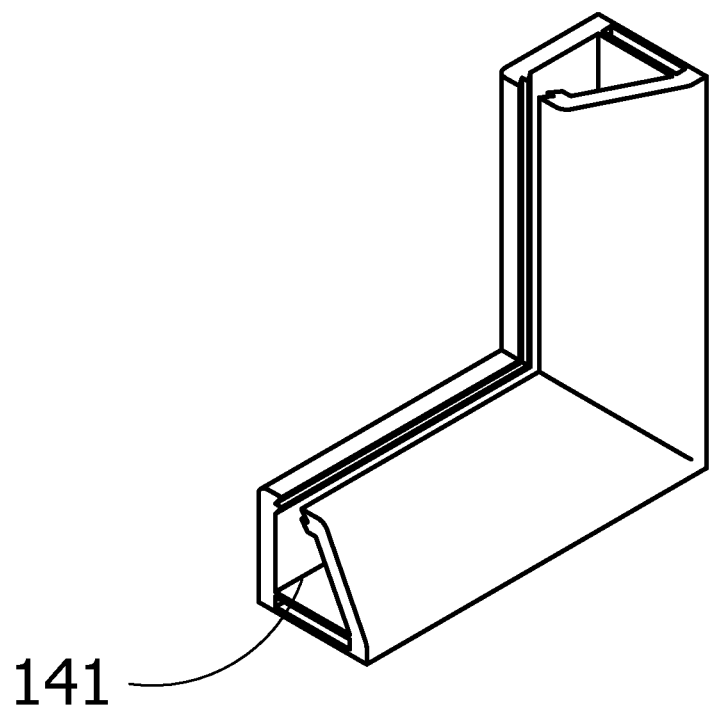
FIG. 7 is a perspective view of display board protective corners.

The life of a display board is often shortened by damage to the edges and corners. Protective corner covers 119*a*, 119*b*, 119*c* and 119*d*, as can be seen in FIG. 4 and FIG. 7, can be placed over the corners of display boards to limit wear and damage. The protective corner covers 119*a*, 119*b*, 119*c* and 119*d* can be shaped somewhat like right angles in order to fit on the corners of display boards. Protective corner covers 119*a*, 119*b*, 119*c* and 119*d*, may be used such that when attached to the display board 100 the bottom protective corner covers 119*d* and 119*c*, lift the display board to the same height as base stands 110*a* and 110*b*, which are attached to the bottom of the display board 100 and are discussed in more detail below. Protective corner protectors 119*a*, 119*b*, 119*c* and 119*d* can be made from many materials that are solid and/or mesh including but not limited to plastics, metal, wood, carbon fiber and composite materials including those with magnetic properties.

Figure 6:
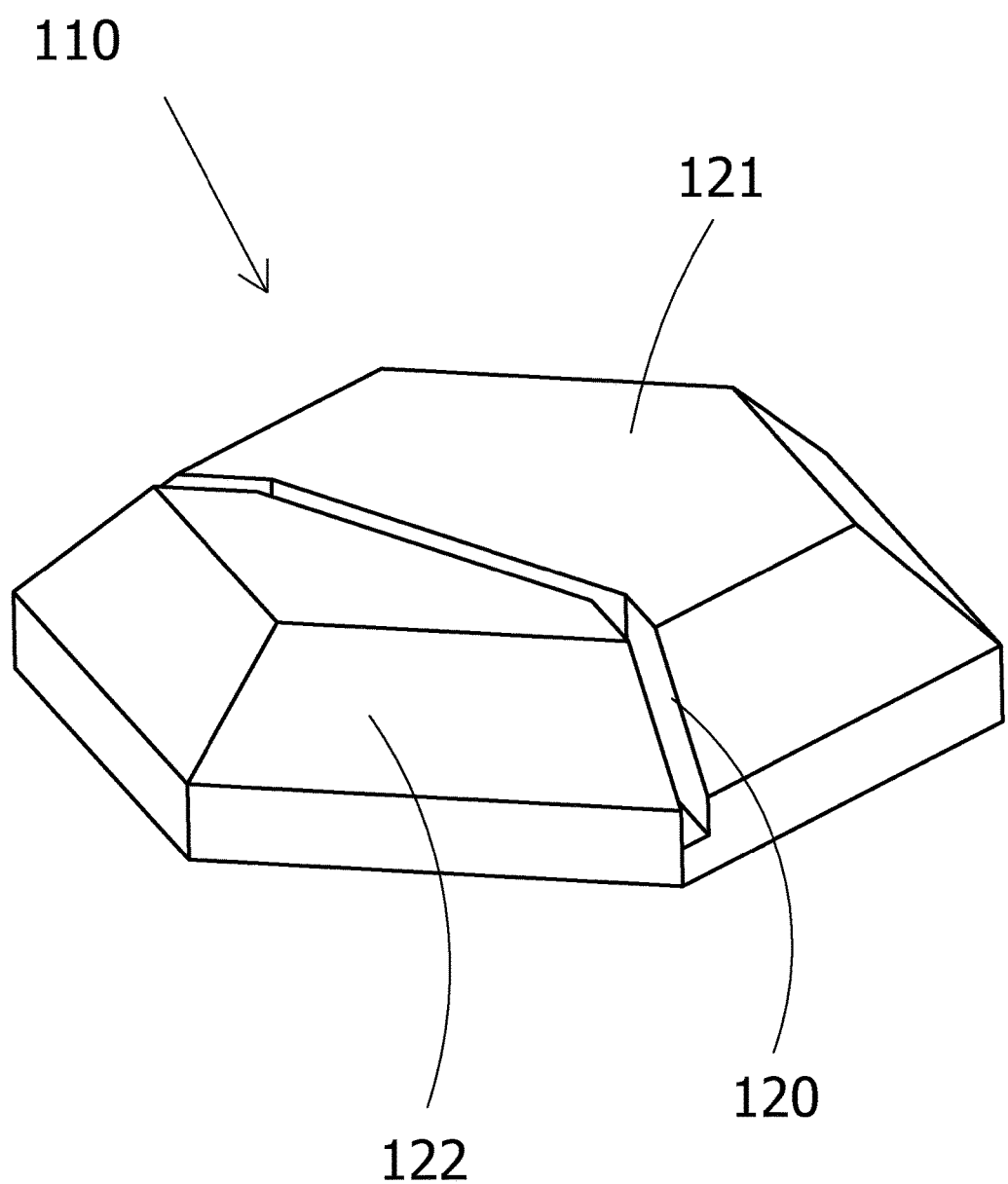
FIG. 6 is a perspective view of base stands of the present invention.

The added weight of the multimedia device when attached to a display board, especially when attached toward the top of the display board, can make the display board prone to toppling over. Display board base stands can assist in stabilizing display boards with multimedia devices attached. The base stands are preferably positioned below the folds on a tri-fold display board, as shown for example in FIG. 1 and FIG. 2. The base stands 110*a* and 110*b* include a slot 120 (as shown in FIG. 6) for the insertion of the display board. The front portion of the base 122 can be somewhat shorter than the back portion 121. The base stands 110*a* and 110*b* can be made from many materials that are solid and or mesh including but not limited to plastics, metal, wood, carbon fiber and composite materials including those with magnetic properties.

FIG. 22 shows how the dual score 108b marks are used to fold of the display board 100 around the multimedia device 109 when mounts 101a and 101b are attached to the display board 100.

Custom Print/Layout Feature

Figure 12:
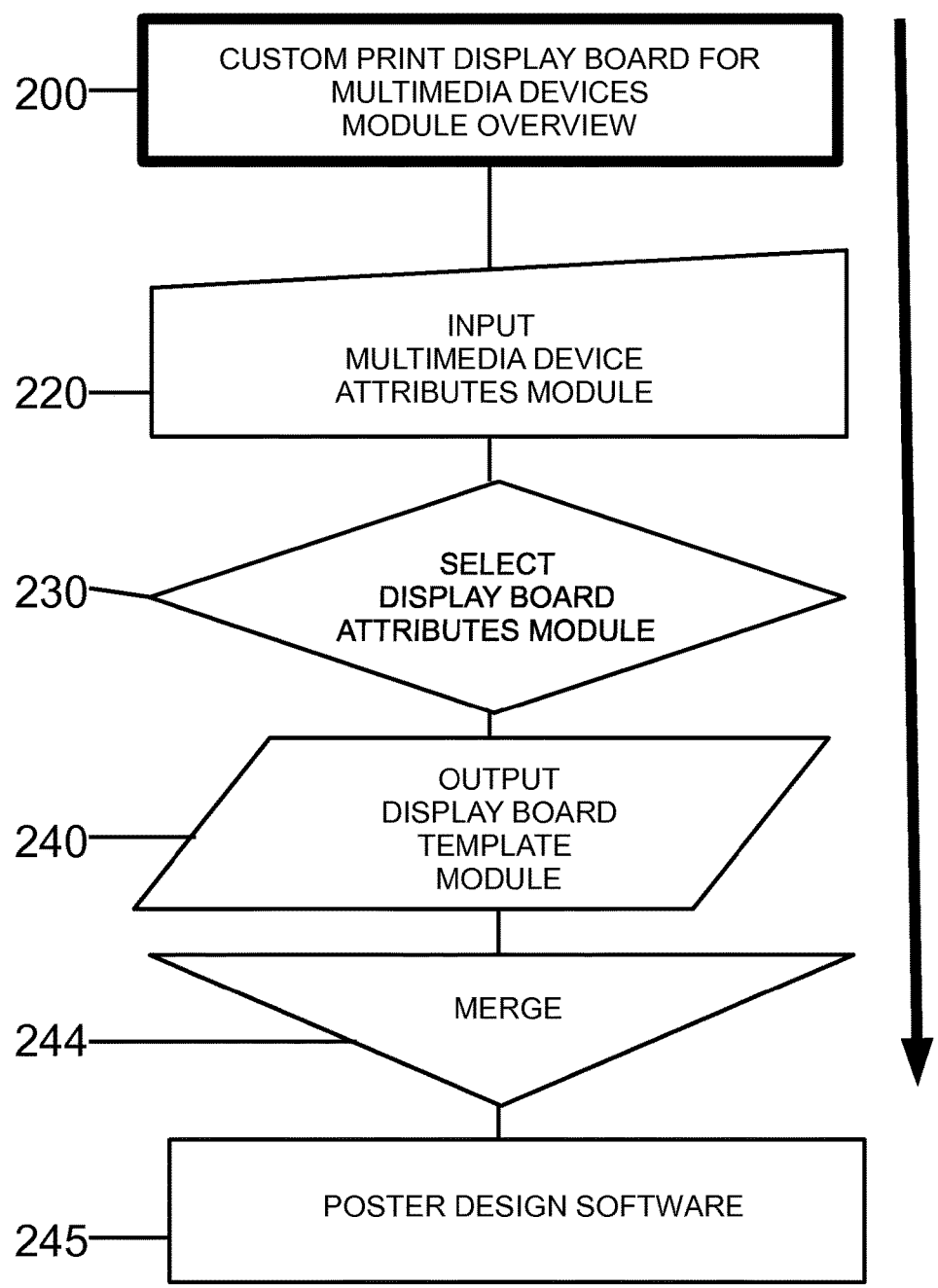
FIG. 12 is a flowchart for a custom print feature of the present invention.
Figure 13:
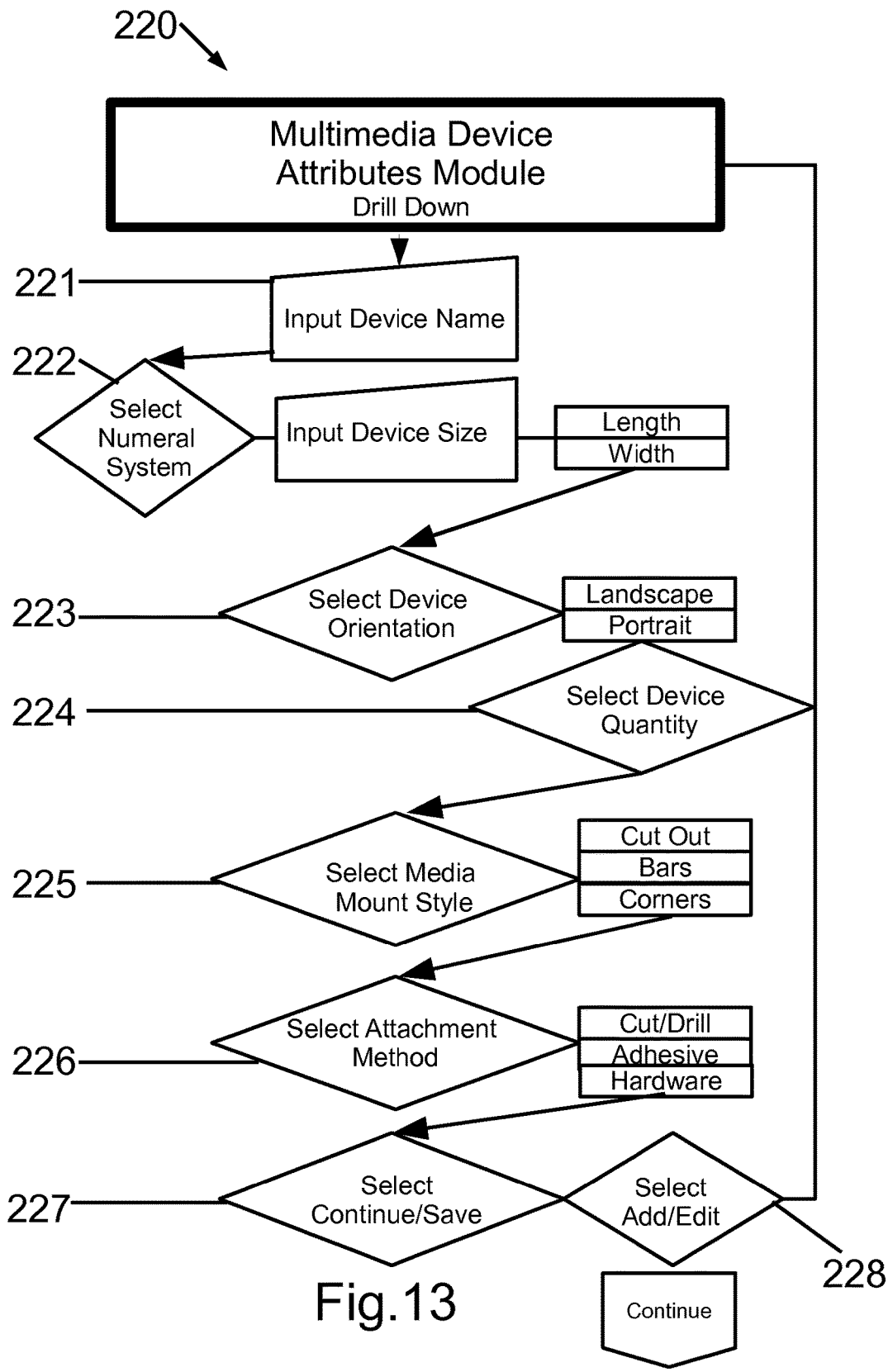
FIG. 13 is a flowchart for an aspect of a custom print feature of the present invention.
Figure 14:
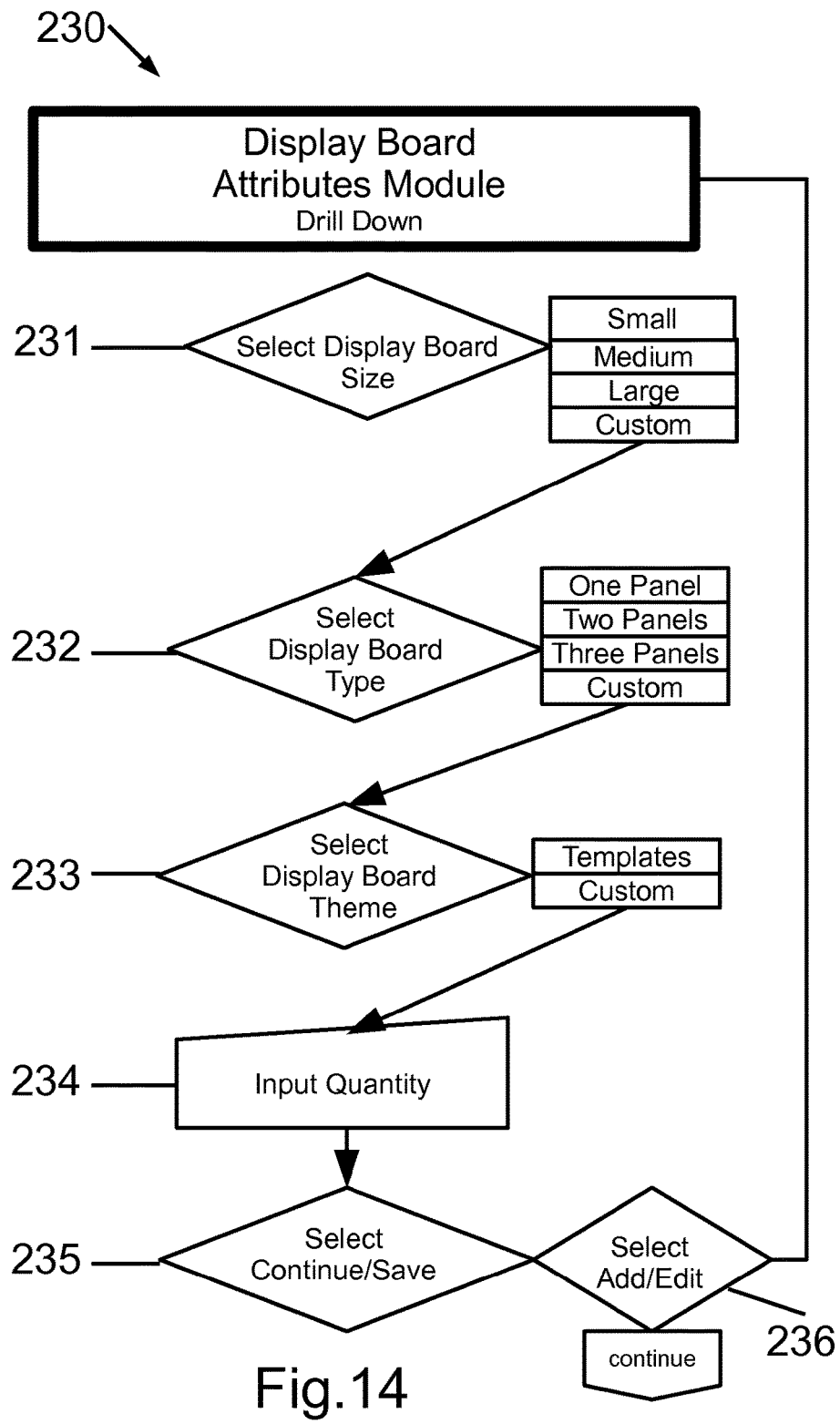
FIG. 14 is a flowchart for another aspect of a custom print feature of the present invention.
Figure 15:
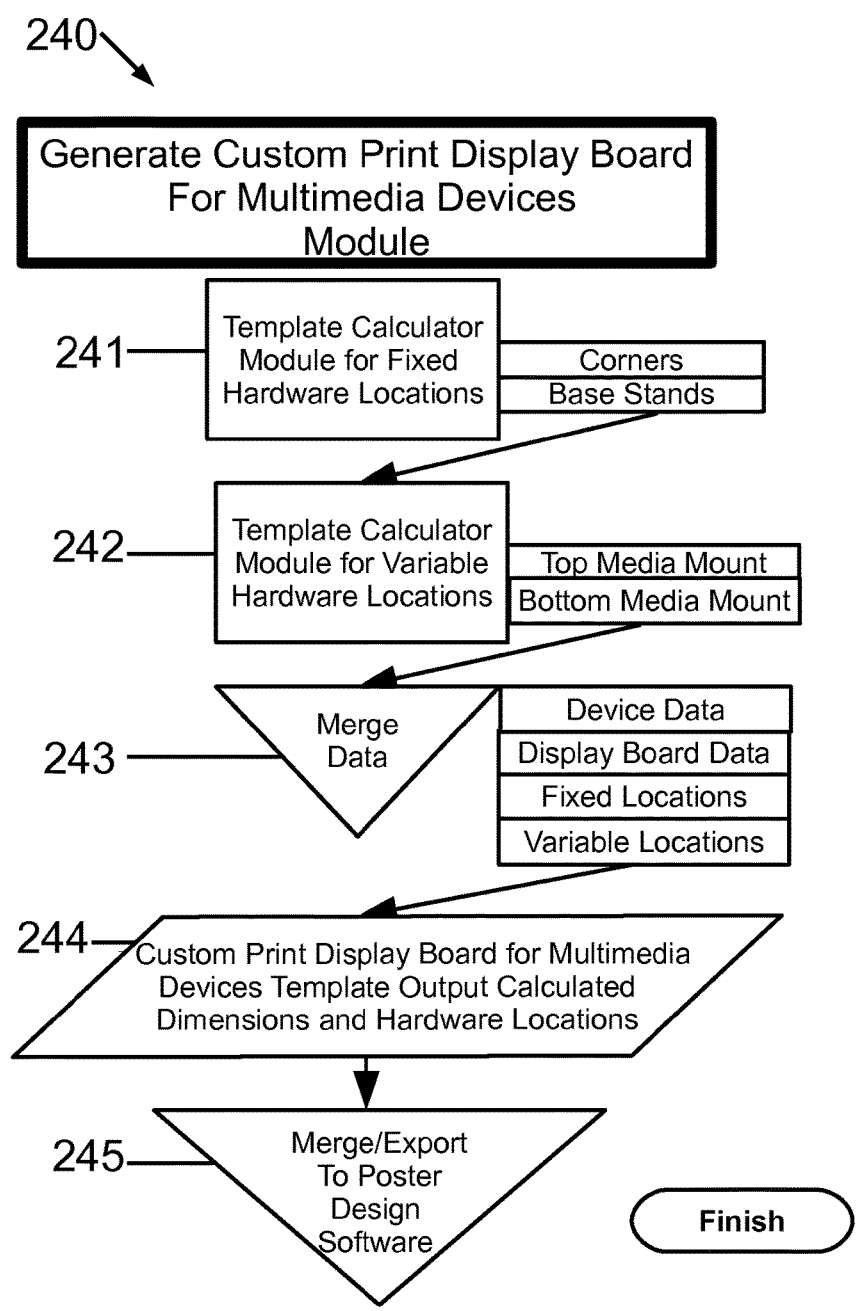
FIG. 15 is a flowchart for another aspect of a custom print feature of the present invention.
Figure 19:
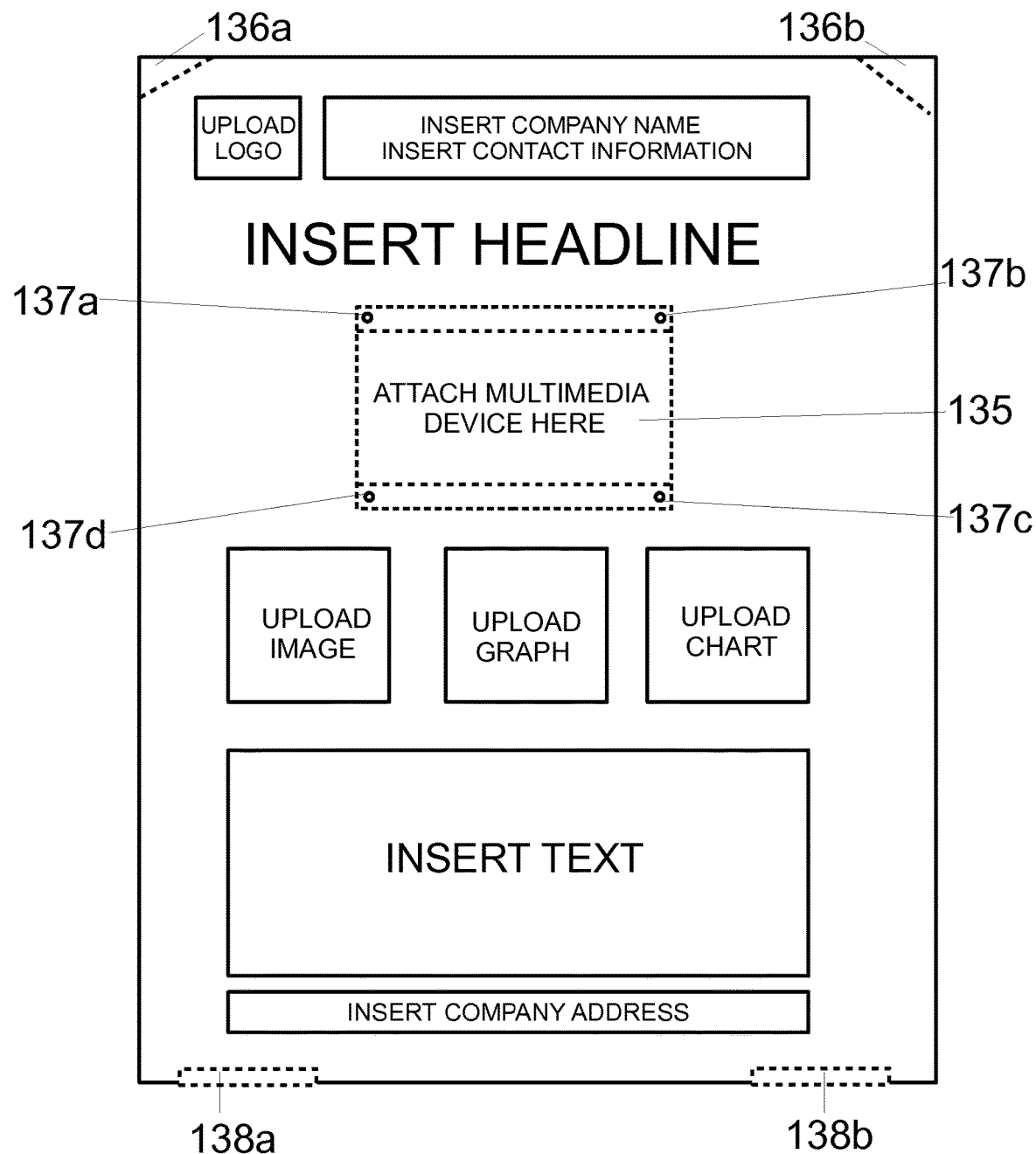
FIG. 19 depicts an example of a possible outcome of the print/layout feature of the present invention.
Figure 20:
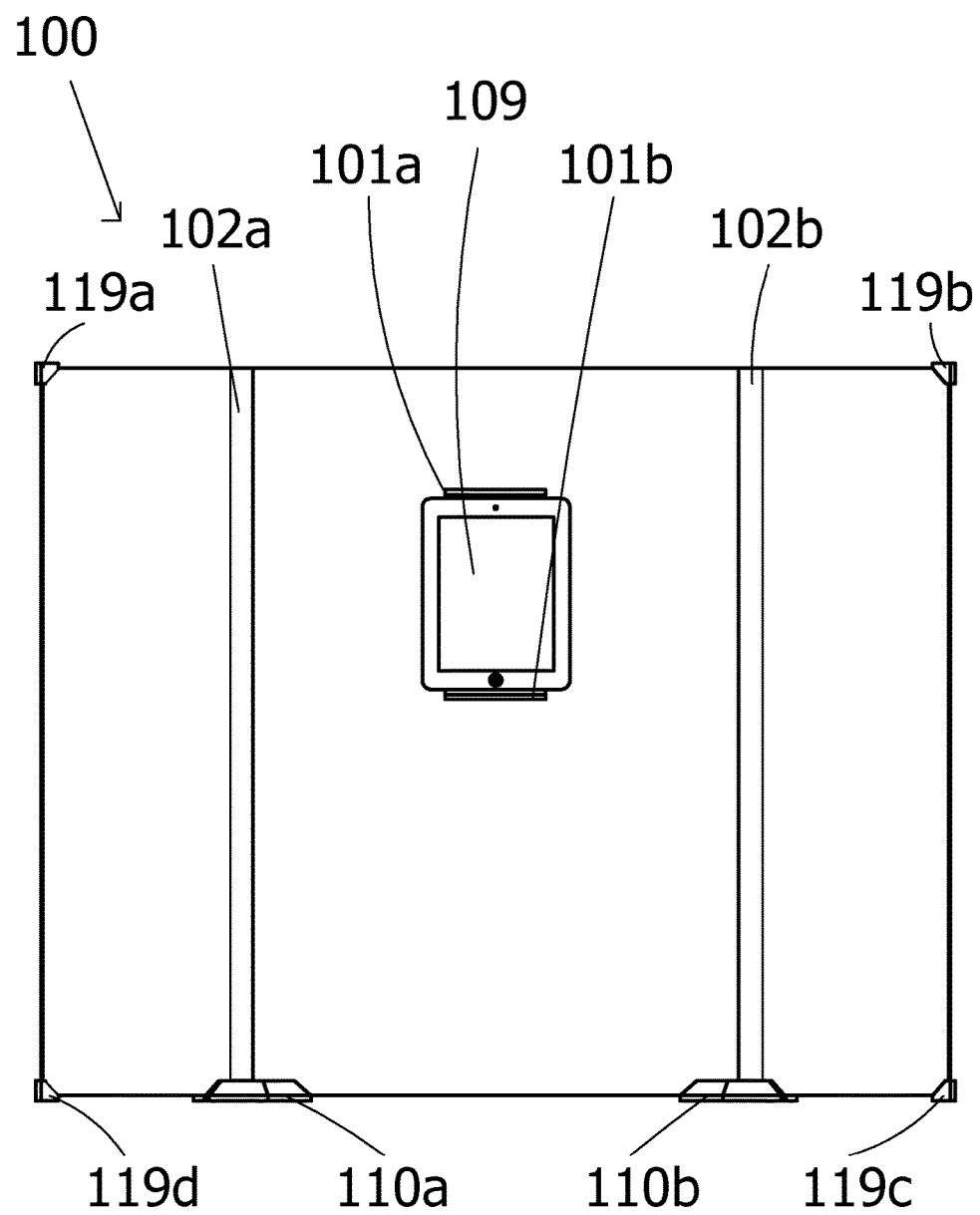
FIG. 20 depicts an example of a portable display board for multimedia devices using the print/layout feature of the present invention.
Figure 21:
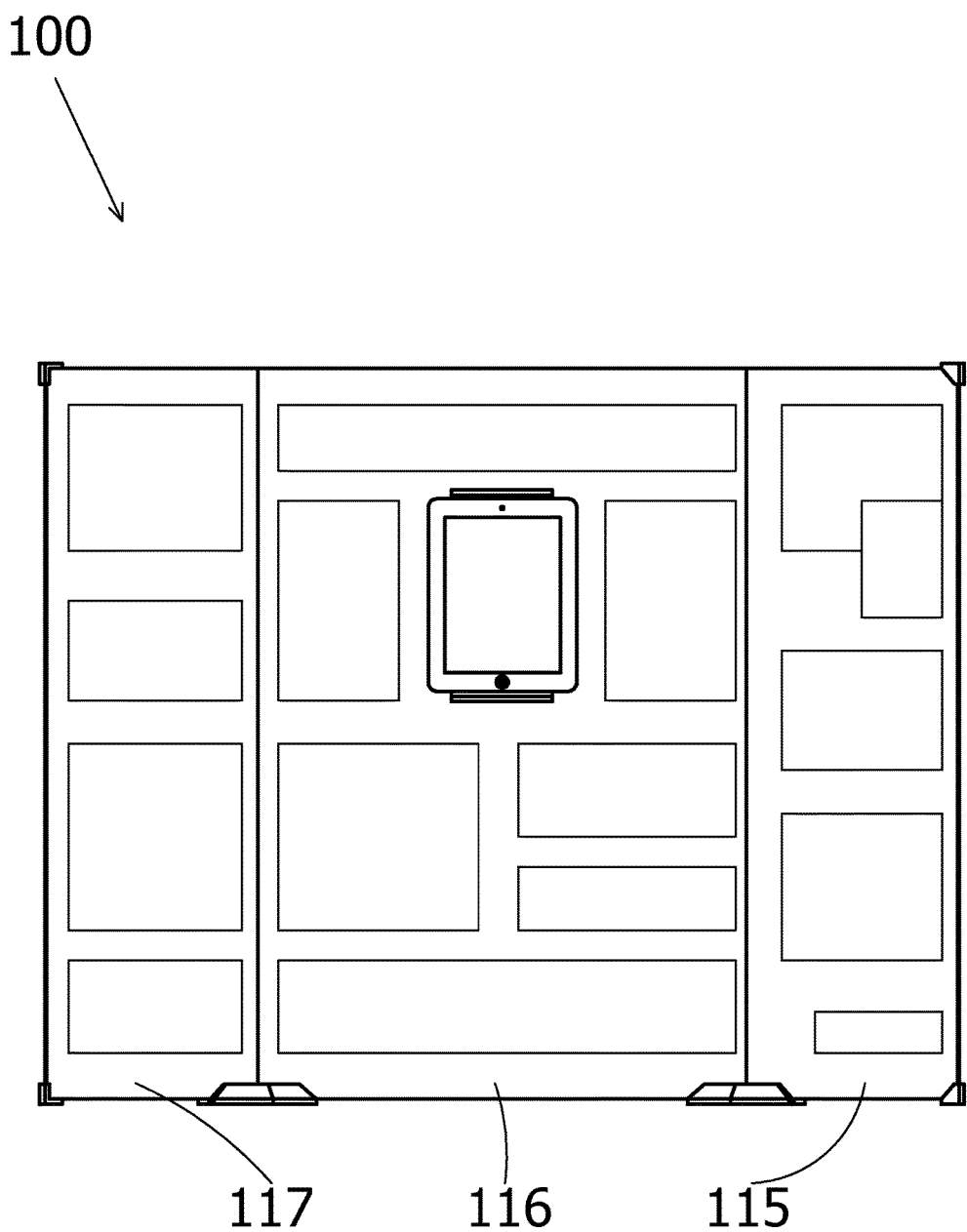
FIG. 21 depicts an in use example of one embodiment of a custom printed and mounted display board of the present invention.

FIG. 12 is an overview of a process for determining the location and method for attaching a device to display boards. When using mounts 101a and 101b the method for attaching the mounts to the display boards is based on factors such as the identity of the multimedia device (and thus its size, shape and orientation), the size and shape of the display board to be used, and the number, size and style (e.g., number of display boards to be printed, the size and shape of the display board and the style of the display board). In addition, appropriate number and locations for base stands 110a or 110b and protective corner covers 119a, 119b, 119c and 119d, can be determined. For example, at 220, a user could input a type of multimedia device to be mounted on a display board, or particular characteristics, such as size, of a multimedia device or devices to be mounted on the display board, as shown in more detail in FIG. 13. Then, at 230, as shown in more detail in FIG. 14, a user could input information and choices regarding the display board to be used, i.e., to have the multimedia device(s) mounted on and other media attached and/or be printed on. At 240, as shown in more detail in FIG. 15, inputs from steps 220 and 230 are used to select or recommend templates and/or additional hardware such as base stands 110a and 110b and protective corner covers 119a, 119b, 119c and 119d. The resulting final output would include locations for the multimedia device mounts 101a and 101b, size and location for static media to be attached to and/or printed on the display board, and types and locations for other hardware such as base stands 110a and 110b and protective corner covers 119a, 119b, 119c and 119d. A preview may be provided such as depicted in FIG. 16 and FIG. 17, and a user could optionally input changes to the preview that fall within possible variances as illustrated in FIG. 18 and FIG. 19. An example of a display board layout using this feature of the present invention can be seen in FIG. 20.

The invention claimed is:

1. A system for mounting an electronic multimedia device to a poster board, the system comprising:
   a tri-fold poster board having a front face, a rear face, a top and a bottom;
   a plurality of score lines in the poster board dividing the poster board into three panels;
   a mount attached to the front face of the poster board, the mount including an upper portion including a groove for receiving at least a portion of an edge of an electronic multimedia device, and a lower portion including a groove for receiving at least a portion of an opposite edge of the electronic multimedia device, wherein the electronic multimedia device is removable from the mount;
   a bottom support extending past the front and rear faces of the poster board, the bottom support having a channel which receives a bottom end of at least one of the score lines, the bottom support being sized and shaped to stabilize the poster board in an upright position; and
   four identical corner covers each attached to a corner of the poster board to protect the corners from impact damage, wherein the two corner covers attached to the corners at the bottom of the poster board are sized such that, in conjunction with the bottom support, a level plane is maintained for the bottom of the poster board.

2. The system of claim 1, wherein the upper portion is connected to the by a hinge.

3. The system of claim 1, wherein the lower portion is connected to the by a hinge.

4. The system of claim 1, wherein the lower portion of the holder is attached to the poster board with a bolt that goes through a washer plate on the rear face of the poster board.

5. The system of claim 1, wherein the holder is attached to the poster board with dual aided adhesive tape.

6. The system of claim 1 wherein the score lines are constructed to allow the panels to fold into a substantially flat configuration.

7. The system of claim 1, wherein the mount further comprises openings for providing access to controls of the electronic multimedia device.

* * * * *